United States Patent [19]

Holcomb et al.

[11] Patent Number: 5,790,133

[45] Date of Patent: *Aug. 4, 1998

[54] METHOD OF RAPIDLY DISPLAYING LARGE DATA RECORDS RETRIEVED BY DEEP MEMORY DIGITAL OSCILLOSCOPES AND LOGIC ANALYZERS

[75] Inventors: Matthew S. Holcomb; Michael L. Beyers, both of Colorado Springs, Colo.

[73] Assignee: Hewlett-Packard Company, Palo Alto, Calif.

[*] Notice: This patent issued on a continued prosecution application filed under 37 CFR 1.53(d), and is subject to the twenty year patent term provisions of 35 U.S.C. 154(a)(2).

[21] Appl. No.: 607,671

[22] Filed: Feb. 27, 1996

[51] Int. Cl.$^6$ ........................................ G06T 1/00
[52] U.S. Cl. ................ 345/501; 345/202; 382/232; 348/403; 358/426
[58] Field of Search ........................ 395/501, 507, 395/508, 114; 345/202, 189, 185, 501, 507, 508; 348/384, 390, 403, 404; 386/101, 109, 111, 112; 382/232, 235, 236, 238, 239, 244–250; 358/426, 261.1–261.4, 427

[56] References Cited

U.S. PATENT DOCUMENTS

| | | | |
|---|---|---|---|
| 5,115,189 | 5/1992 | Holcomb | 345/134 |
| 5,173,772 | 12/1992 | Choi | 348/416 |
| 5,283,667 | 2/1994 | Kojima et al. | 358/448 |
| 5,553,160 | 9/1996 | Dawson | 358/430 |

*Primary Examiner*—Kee M. Tung

[57] ABSTRACT

A method, and circuit for implementing the method, allow a deep memory digital oscilloscope or logic analyzer to rapidly display large data records. Incoming signals are "dually" processed through multiple data compression circuits so as to create and store at least two data records. A smaller record is available for immediate and rapid display. A larger record is available for subsequent panning & zooming. By storing sequential data records in alternating memory divisions and eliminating data moves, the larger record may also be viewed more rapidly.

25 Claims, 6 Drawing Sheets

METHOD OF RAPIDLY DISPLAYING LARGE DATA RECORDS RETRIEVED BY DEEP MEMORY DIGITAL OSCILLOSCOPES AND LOGIC ANALYZERS

BACKGROUND OF THE INVENTION

This invention pertains to digital oscilloscopes and logic analyzers, and more particularly, to a method of rapidly displaying large data records retrieved by deep memory digital oscilloscopes and logic analyzers. A circuit for implementing the method is also disclosed.

A first problem with current deep memory digital oscilloscopes and logic analyzers is that they can acquire and store data records much faster than they can process and display them.

Figure 6:
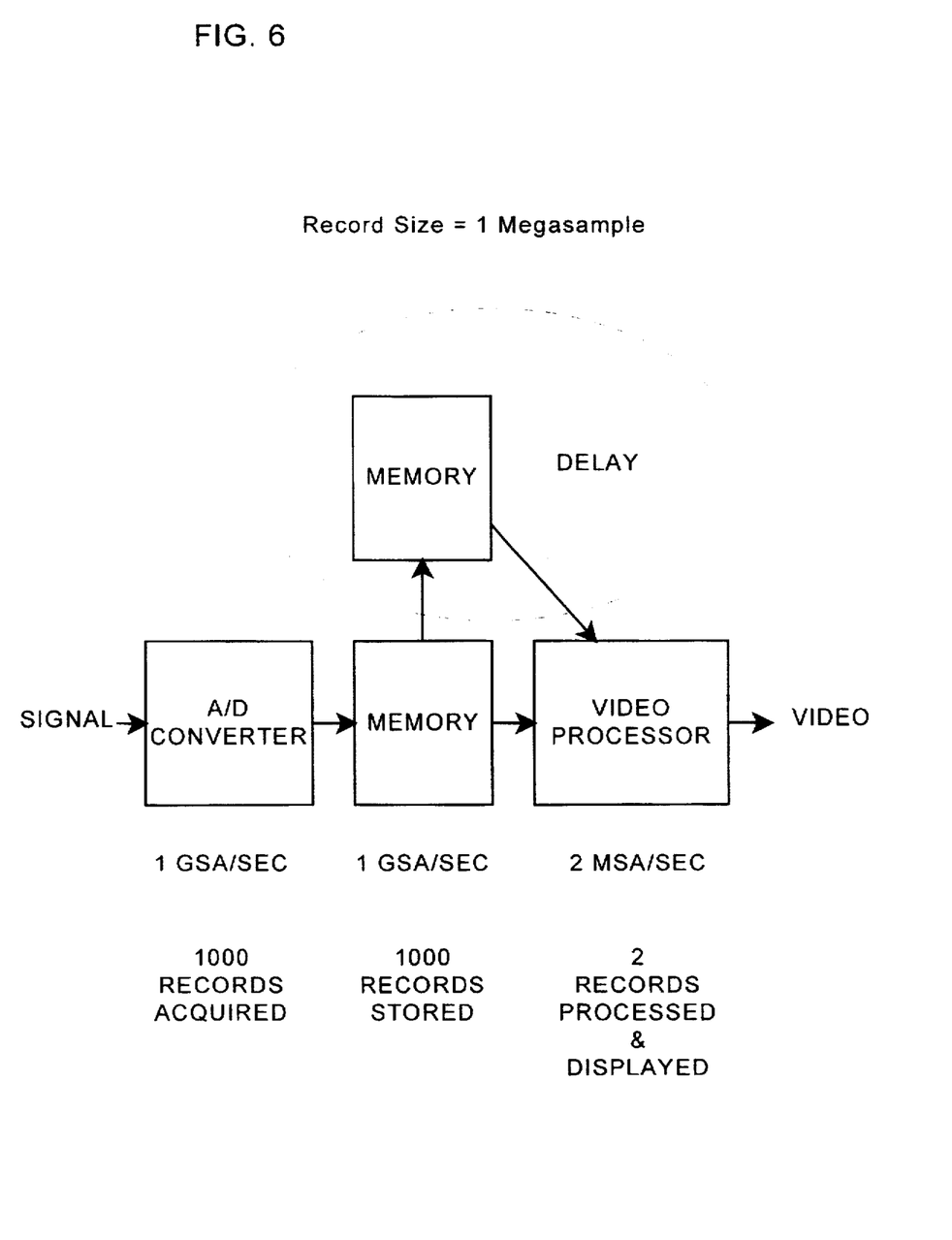
FIG. 6 is a block diagram presenting the problems solved by the method disclosed herein.

Currently available A/D converters can sample a signal at the rate of several Gigasamples/second. However, currently available video processors can only process these samples at a rate of several Megasamples/second. Consider an oscilloscope comprising an A/D converter sampling at the rate of 1 Gigasample/second, a memory, a video processor working at a rate of 2 Megasamples/second, and a data record size of 1 Megasample (see FIG. 6). Such an oscilloscope can acquire and store records to memory at a rate of 1000 records/second, but process and display those records to video at a rate of only 2 records/second. The resulting difference between acquisition and display rates is a problem of great concern.

Several solutions have been posed for this problem. A first solution is to limit the number of displayed samples to a relatively small number, commonly 500. This solution yields a faster display rate, but artificially limits the sampling rate to the processing rate. A limited sample rate will allow many signal glitches to go undetected.

A second solution is to give a user independent controls over both update rate and record length. A user can then decide which attribute is most important—a high update rate or a long record length. Alternatively, a user can sacrifice each to achieve an optimum combination. However, it is impossible to achieve both a high update rate and a long record length.

Another solution involves use of a data compression algorithm such as "peak detect". A peak detect algorithm divides a signal into time intervals. For each time interval, samples are stored in the form of a min/max pair. Thus a 500 pair peak detect record can be used to rapidly display the highlights (or glitches) of a very large record. However, when a record is compressed to 500 sample pairs, much of the fine detail available in a larger record (i.e. —a "deep" record of several Megasamples) is lost. As a result, it is not possible to "pan & zoom" on a smaller portion of a peak detect record. The loss of pan & zoom capabilities can be cured by increasing the number of peak detect sample pairs. However, as the number of sample pairs is increased, display time for a record is also increased.

Other data compression algorithms include: 1) summing (averaging all samples in a given time interval), 2) low frequency dither (randomly picking one sample in a time interval), as described in U.S. Pat. No. 5,115,189 to Holcomb which is hereby incorporated by reference, or 3) glitch detect (keeping track of whether a sample crosses above or below a digital threshold). However, all of these compression algorithms suffer from the problems associated with peak detect.

A second problem which hinders rapid display of large data records in deep memory oscilloscopes and logic analyzers is memory allocation.

Current oscilloscopes and logic analyzers have two memories for storing data records. Records are initially stored in a first memory, and then dumped to a second memory. The second memory is used to preserve pan & zoom data since the first memory is being continuously overwritten with newly acquired records. Dual memories are undesirable in that the reading and writing of large data records uses valuable processing time and slows video displays.

It is therefore a primary object of this invention to provide a method of rapidly displaying large data records retrieved by deep memory digital oscilloscopes and logic analyzers.

It is also an object of this invention to create a smaller data record for immediate display, and a larger record for subsequent pan & zoom requests.

It is a further object of this invention to achieve the foregoing object without significantly decreasing the size of a data record available for panning & zooming.

It is yet another object of this invention to eliminate the transfer of data from one memory to another.

SUMMARY OF THE INVENTION

In the achievement of the foregoing objects, the inventors have devised a method of rapidly displaying large data records retrieved by deep memory digital oscilloscopes and logic analyzers comprising the following steps. First, the oscilloscope's memory is divided into first and second divisions. Next, a digitized data record created from an input signal is run through a first data compression circuit. The output of the first data compression circuit is stored in a first section of either the first or second memory divisions, and is also run through a second data compression circuit. The output of the second data compression circuit is stored in a second section of either the first or second memory divisions, and is also displayed to video. But for the memory division step, the above steps are repeated, alternately storing data in the first and second memory divisions. When a pan & zoom request is received, a portion of the output stored in the first section of the memory division which is not being written to will be displayed.

The above described method, and a circuit for implementing the same, allow a deep memory digital oscilloscope or logic analyzer to rapidly display large data records. Incoming signals are "dually" processed through multiple data compression circuits so as to create and store at least two data records. A smaller record is available for immediate and rapid display. A larger record is available for subsequent panning & zooming. By storing sequential data records in alternating memory divisions and eliminating data transfers, the larger record may also be viewed more rapidly.

These and other important advantages and objectives of the present invention will be further explained in, or will become apparent from, the accompanying description, drawing and claims.

BRIEF DESCRIPTION OF THE DRAWINGS

Illustrative and presently preferred embodiments of the invention are illustrated in the drawing in which.

DESCRIPTION OF THE PREFERRED EMBODIMENTS

Figure 1:
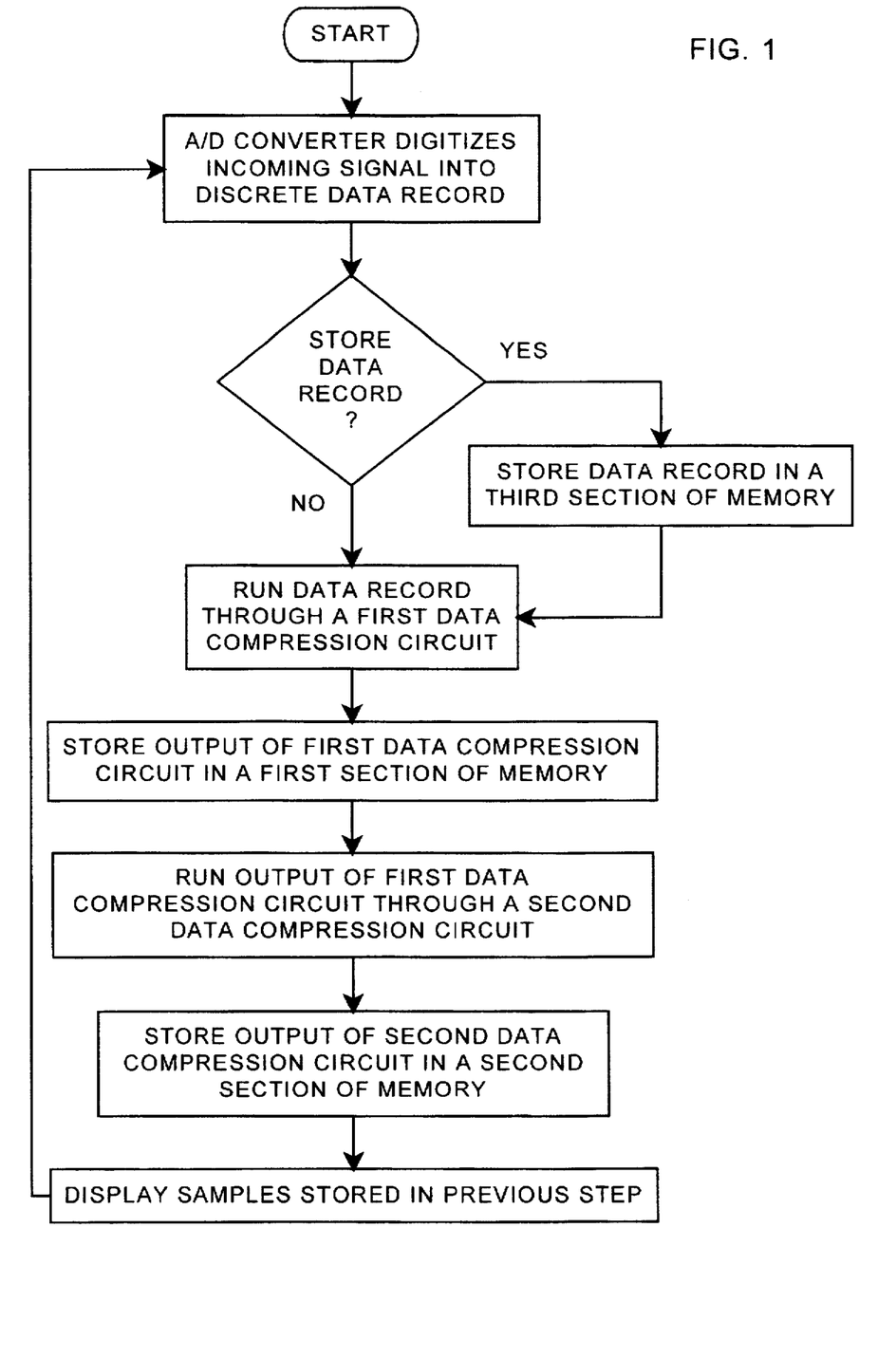
FIG. 1 is a flow chart of a first embodiment of a method disclosed herein.

The steps for a method of rapidly displaying large data records retrieved by deep memory digital oscilloscopes and logic analyzers 68 (collectively referred to as signal display devices) are shown in FIG. 1. The method may generally comprise the steps of running a digitized data record created from an input signal through a first data compression circuit 10 (FIG. 2), storing an output 12 of the first data compression circuit 10 in a first section 14 of a memory 16, running the output 12 of the first data compression circuit 10 through a second data compression circuit 18, storing an output 20 of the second data compression circuit 18 in a second section 22 of said memory 16, and graphically displaying the output 20 of the second data compression circuit 18.

Having thus described the method in general, the method will now be described in further detail.

In a first preferred embodiment of the method (FIGS. 1 & 2), the method begins as a signal is input into an A/D converter 24. The input signal may comprise several channels, but for ease of explanation, only one will be considered. Preferably, the A/D converter 24 has a sample rate of several Gigasamples/second. The converter 24 produces a digitized data record comprising numerous discrete samples. The converter's output 34 may be further processed through a low ratio decimator 26 before being stored in a section 28 of deep memory 16 (a deep memory is a memory capable of storing several Megasamples).

Figure 2:
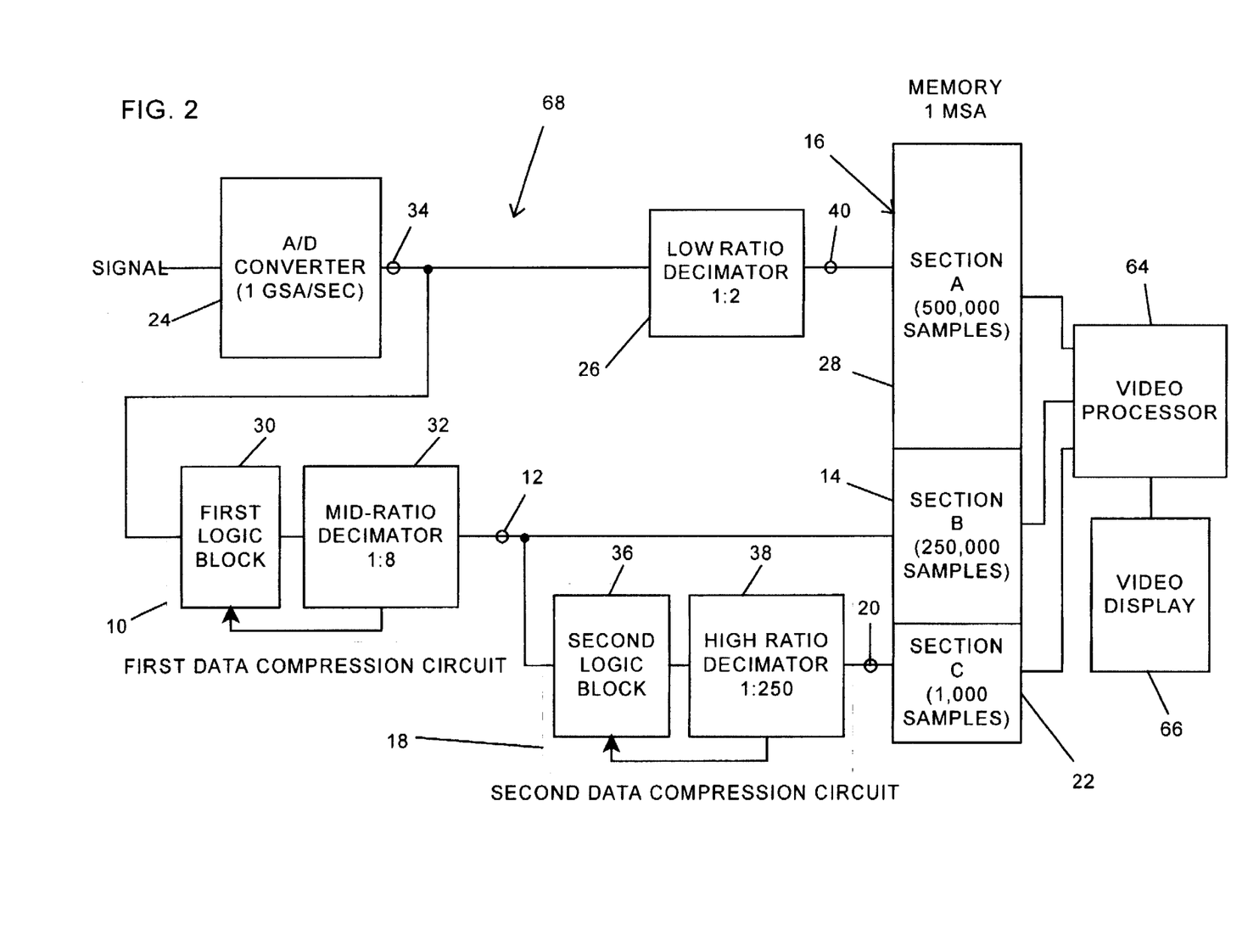
FIG. 2 is a schematic of a circuit implementing the method of FIG. 1.

The converter's output 34 (or the output of the low ratio decimator 40) is also fed into a first data compression circuit 10. The data compression circuit comprises a logic block 30 and a mid-ratio decimator 32. The mid-ratio decimator 32 lies in the feedback path of the logic block 30 and serves as a counter for determining the compression interval. A sample (or sample pair) will be stored for each interval. If the data compression circuit 10 is of the peak detect variety, it will form min/max sample pairs. If the data compression circuit 10 is of the glitch detect variety, it will store individual samples. The samples (or sample pairs) generated by the data compression circuit 10 will be stored in a first section 14 of deep memory 16.

The output 12 of the first data compression circuit 10 will also be fed into a second data compression circuit 18. The second data compression circuit 18 is similar to the first 10, but for the fact that it comprises a high ratio decimator 38. By connecting the second data compression circuit 18 in series with the first 10, and running it off of the output 12 of the first 10, the second data compression circuit 18 has fewer samples to process. As a result, it runs faster and more efficiently than if it would have been connected directly to the converter output 34. The logic block 30 of the second data compression circuit 18 preferably implements the same compression algorithm as the logic block 36 of the first 10.

The samples (or sample pairs) produced by the second data compression circuit 18 will be fewer in number than the samples produced by the first data compression circuit 10. This second set of compressed data is called "Dual Rate" data. It has been "dually" processed through multiple data compression circuits 10, 18. The Dual Rate data is stored in a second section 22 of deep memory 16.

Consider, for example, an oscilloscope 68 comprising the circuitry of FIG. 2. The oscilloscope 68 shown therein may comprise a 1 Gigasample/second A/D converter 24; low, mid-, and high ratio decimators operating at ratios of 1:2, 1:8 and 1:250, respectively 26, 32, 38; a 1 Megasample memory 16; and a 2 Megasample/second video processor 64. Assume that the oscilloscope 68 is set to use a 1 Megasample data record and that both logic blocks 30, 36 are programmed to implement peak detect compression algorithms. As a 1 Megasample record comes out of the A/D converter 24, it is decimated via the low ratio decimator 26 and 500,000 samples are stored in memory Section A 28. The 1 Megasample record is further fed through a first data compression circuit 10 (using the mid-ratio 1:8 decimator 32). This circuit 10 produces 125,000 peak detect sample pairs (or 250,000 individual samples) which are stored in memory Section B 14. The output of the first data compression circuit 10 is also routed through a second data compression circuit 18 (using the high ratio 1:250 decimator 38). The second data compression circuit 18 produces 500 peak detect sample pairs (or 1000 individual samples) which are stored in memory Section C 22.

Thus, two sets of peak detect samples are stored in memory 16. The smaller set of 500 sample pairs is used to immediately display a signal's waveform. The larger set of 125,000 sample pairs (or even the 500,000 sample record) is available should a user want to later pan & zoom on a smaller portion of a signal's waveform.

It is important to note that the problem of rapidly displaying a large data record is solved. The 1 Gigasample/second A/D converter 24 will produce 1000 records/second, each being 1 Megasample in length. When display data comprises 500 min/max sample pairs, the video processor 64, operating at 2 Megasamples/second, can display up to 2000 records/second on the video display 66. This is more than fast enough to keep up with the A/D converter 24.

Furthermore, a record of 125,000 min/max sample pairs and a record of 500,000 individual samples exist for later pan & zoom requests. In an alternative embodiment, the 500,000 sample uncompressed record could be eliminated, and a larger compressed (e.g., peak detect) record could be stored for panning & zooming.

Since the deep memory 16 is being continuously rewritten by newly acquired data records, the data stored in memory 16 must be copied into a second memory. See FIG. 6. If this is not done, the larger pan & zoom records can become corrupted before they are displayed. However, copying data from one memory to another causes significant delay. If a large record is in the process of being copied, there is a lag time before another record acquisition can begin. Since it is an object of this invention to rapidly display large data records, a second preferred embodiment which cures this additional display problem is shown in FIGS. 3 and 4.

Instead of reading data out of a first memory and into a second, a "Ping Pong" memory storage method has been developed. In Ping Pong storage, the oscilloscope's, or logic analyzer's, deep memory 16 is first divided into two divisions 42, 44. Within each of these two divisions 42, 44, the memory 16 is further sectioned as described, supra. In this manner, Sections AA 46, BB 48 & CC 50 and XX 52, YY 54 & ZZ 56 are created. Two memories are not needed. As a consequence, video displays are not slowed during memory read/write operations.

Sequentially acquired records (in a series of data records) are stored in alternating divisions 42, 44 of memory 16 through use of Ping Pong Gates A 58, B 60 and C 62. Each gate is responsive to the receipt of a new digitized data record such that the gate is capable of alternately storing data in one memory division 42 or the other 44.

Figure 3:
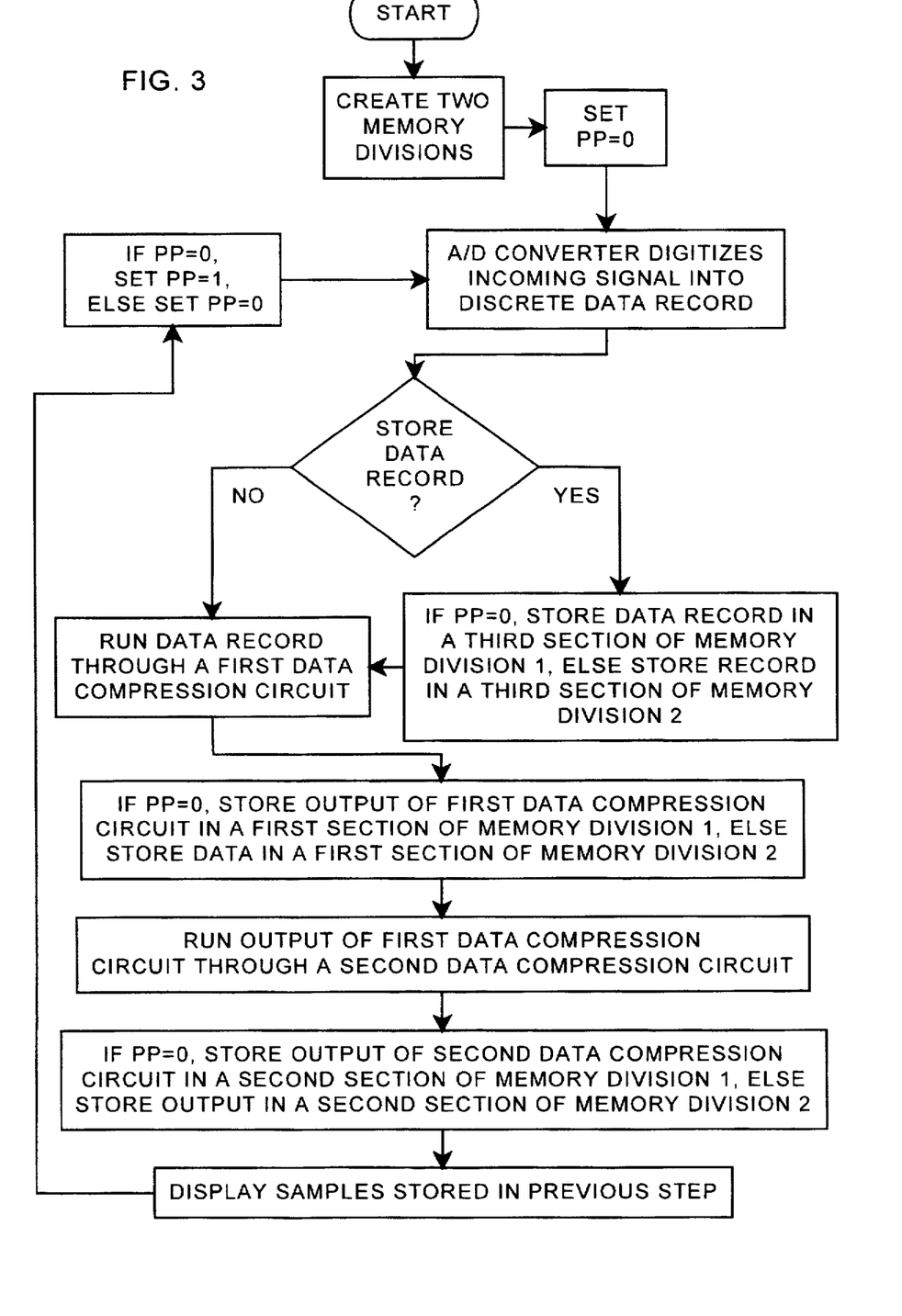
FIG. 3 is a flow chart of a second embodiment of a method disclosed herein.
Figure 4:
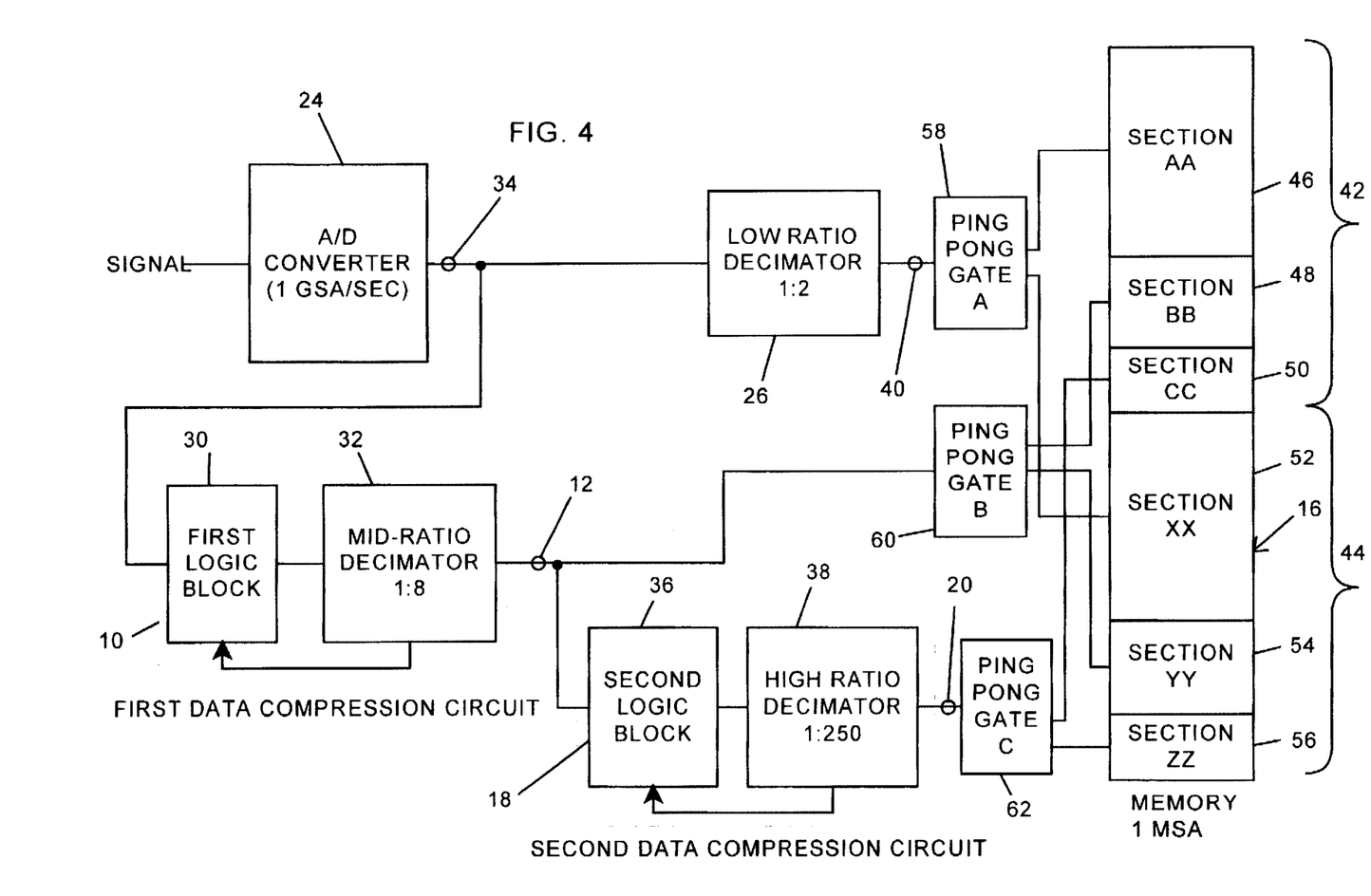
FIG. 4 is a schematic of a circuit implementing the method of FIG. 3.
Figure 5:
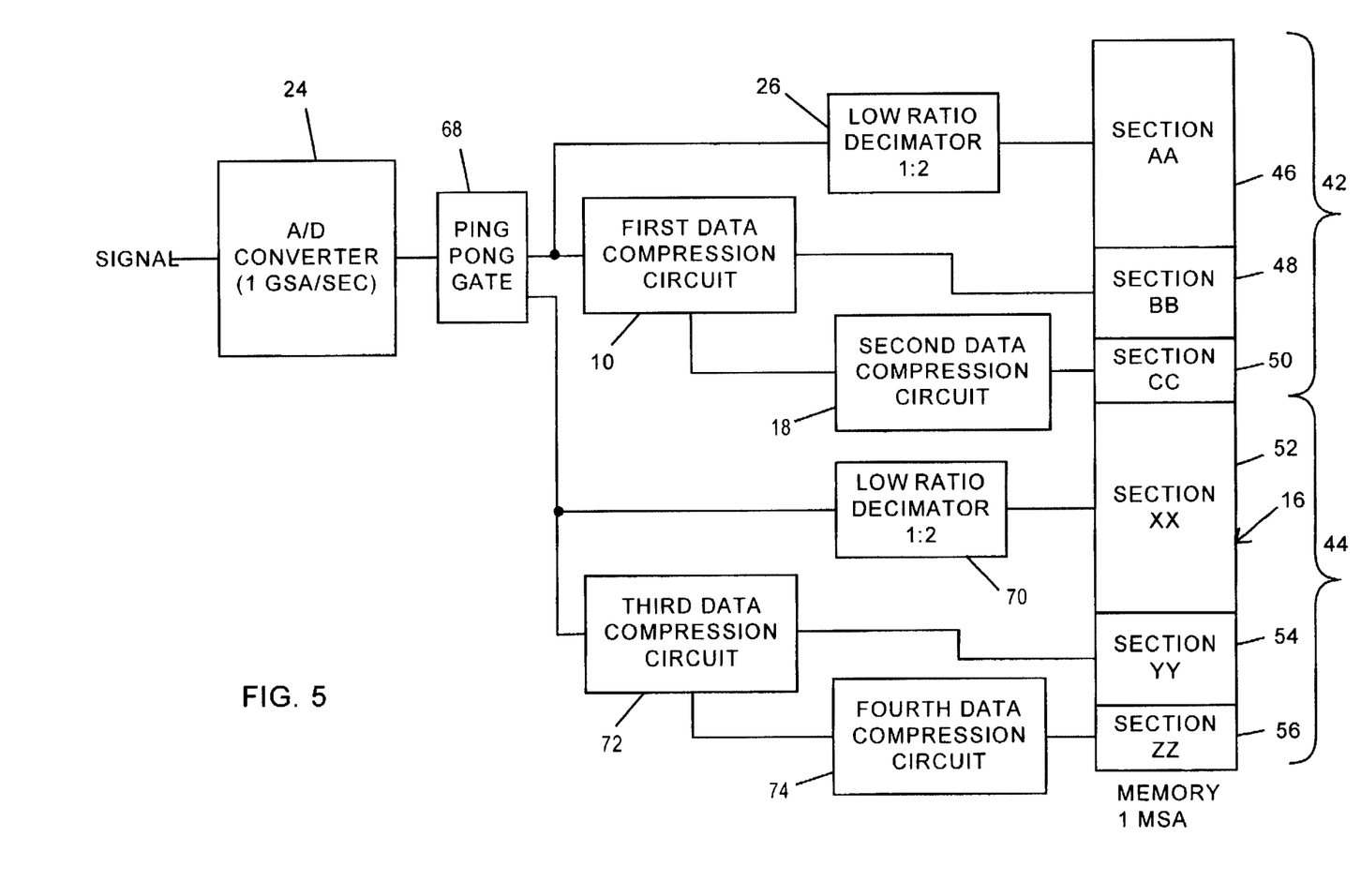
FIG. 5 is a schematic of a circuit implementing a variation of the FIG. 3 method.

In a variation of the FIG. 3 method, as implemented in the schematic of FIG. 5, ping pong gating could be done before data enters the data compression circuits 10, 18, 72, 74. In this arrangement, a single Ping Pong Gate 68 and four data compression circuits 10, 18, 72, 74 would be required. Two of the data compression circuits 10, 18 would be associated with one memory division 42, and two 72, 74 would be associated with another memory division 44. Data would be alternately fed through either the first 10 and second 18 data compression circuits or the third 72 and fourth 74 data compression circuits.

To appreciate the advantages of Ping Pong gating, assume that each division 42, 44 of a 1 Megasample memory 16 comprises 500,000 bytes. Each division 42, 44 could store a 250,000 sample uncompressed data record, a 125,000 sample peak detect record comprising 62,500 sample pairs, and a 1000 sample peak detect record comprising 500 sample pairs. If a user inputs a request to pan & zoom on a portion of a signal waveform, data is available in one division 42, 44 while a new record is being concurrently stored in another division 44, 42.

Given the above examples, it can be appreciated that an oscilloscope displaying Dual Rate data records can display 2,000 records/second, whereas the same oscilloscope without Dual Rate data can only display 2 records/seconds. This is a 1000:1 increase in the display rate. Yet even if the Dual Rate oscilloscope uses Ping Pong storage, there is only a 4:1 decrease in the record size available for panning & zooming. Furthermore, since Ping Pong storage eliminates data transfers, lag time in accessing larger pan & zoom records is eliminated, thereby further increasing video display rates.

Although Ping Pong storage can be advantageous under any set of operating conditions (even in an oscilloscope or logic analyzer which does not implement Dual Rate data), Dual Rate data is specifically advantageous for oscilloscopes or logic analyzers utilizing high sample rates and deep memories. As the sampling rate approaches the rate of the video processor, Dual Rate data is of no assistance because the video processor works fast enough to display the incoming data records. Video "dead time" is not present. Furthermore, if an oscilloscope or logic analyzer has limited memory, an acquired record will already be small in size, and there is no need to create an even smaller record for rapid display.

While illustrative and presently preferred embodiments of the invention have been described in detail herein, it is to be understood that the inventive concepts may be otherwise variously embodied and employed and that the appended claims are intended to be construed to include such variations except insofar as limited by the prior art.

What is claimed is:

1. A method of rapidly displaying large data records retrieved by a deep memory signal display device, comprising the steps of:
    a) running a digitized data record created from an input signal, the digitized data record comprising a first number of samples, through a first data compression circuit so as to produce an output comprising a second number of samples, the second number of samples being fewer than the first number of samples and providing a less detailed view of the input signal than the first number of samples;
    b) storing the output of the first data compression circuit in a first section of a memory;
    c) running the output of the first data compression circuit through a second data compression circuit so as to produce an output comprising a third number of samples, the third number of samples being fewer than the second number of samples and providing a less detailed view of the input signal than the second number of samples;
    d) storing the output of the second data compression circuit in a second section of said memory; and
    e) graphically displaying the output of the second data compression circuit.

2. A method as in claim 1, further comprising the step of storing the digitized data record of step a) to a third section of said memory, before running it through either of the data compression circuits.

3. A method as in claim 1, further comprising the steps of:
    a') before step a), subdividing said memory into first and second divisions; and
    f) after step e), repeating steps a)–e) on a series of digitized data records created from said input signal, wherein in odd numbered repetitions of the steps, the first and second memory sections are sections of said first memory division, and in even numbered repetitions of the steps, the first and second memory sections are sections of said second memory division.

4. A method as in claim 3, further comprising the steps of:
    g) graphically displaying a portion of the output stored in the first section of said first memory division whenever a pan & zoom request is received by said deep memory signal display device during an even numbered repetition of steps a)–e); and
    h) graphically displaying a portion of the output stored in the first section of said second memory division whenever said pan & zoom request is received by said deep memory signal display device during an odd numbered repetition of steps a)–e).

5. A method as in claim 3, further comprising the step of storing the digitized data record of step a) to a third section of said memory, without running it through either of the data compression circuits, this step being repeated along with steps a)–e), wherein in odd numbered repetitions of the steps, the third memory section is a section of said first memory division, and in even numbered repetitions of the steps, the third memory section is a section of said second memory division.

6. A method as in claim 5, further comprising the steps of:
    g) graphically displaying a portion of either the digitized data record stored in the third section of said first memory division or the output stored in the first section of said first memory division whenever a pan & zoom request is received by said deep memory signal display device during an even numbered repetition of steps a)–e); and
    h) graphically displaying a portion of either the digitized data record stored in the third section of said second memory division or the output stored in the first memory section of said second memory division whenever said pan & zoom request is received by said deep memory signal display device during an odd numbered repetition of steps a)–e).

7. A method of rapidly displaying large data records retrieved by a deep memory signal display device, comprising the steps of:
    a) subdividing a memory into first and second divisions;
    b) running one record in a series of digitized data records, wherein said series of digitized data records is created from an input signal, through a first data compression circuit;

c) storing an output of the first data compression circuit in a first section of said first memory division;

d) running the output of the first data compression circuit through a second data compression circuit;

e) storing an output of the second data compression circuit in a second section of said first memory division;

f) graphically displaying the output of the second data compression circuit;

g) running another record in the series of digitized data records, said record immediately succeeding the record of step b) in said series of digitized data records, through a third data compression circuit;

h) storing an output of the third data compression circuit in a first section of said second memory division;

i) running the output of the third data compression circuit through a fourth data compression circuit;

j) storing an output of the fourth data compression circuit in a second section of said second memory division;

k) graphically displaying the output of the fourth data compression circuit; and l) repeating steps b)–k), wherein the one record in a series of digitized data records, referred to in step b), immediately succeeds the record of step g) in said series of digitized data records.

8. A method as in claim 7, further comprising the steps of:

m) graphically displaying a portion of the stored output of the first data compression circuit whenever a pan & zoom request is received by said deep memory signal display device during the performance of any of steps g)–k); and n) graphically displaying a portion of the stored output of the third data compression circuit whenever a pan & zoom request is received by said deep memory signal display device during the performance of any of steps b)–f).

9. A method as in claim 7, further comprising the steps of:

b') storing the digitized data record of step b) to a third section of said first memory division, without running it through either of the first or second data compression circuits; and g') storing the digitized data record of step g) to a third section of said second memory division, before running it through either of the third or fourth data compression circuits.

10. A method as in claim 9, further comprising the steps of:

m) graphically displaying a portion of either the digitized data record stored in the third section of said first memory division or the stored output of the first data compression circuit whenever a pan & zoom request is received by said deep memory signal display device during the performance of any of steps g)–k), inclusive of step g'); and n) graphically displaying a portion of either the digitized data record stored in the third section of said second memory division or the stored output of the third data compression circuit whenever a pan & zoom request is received by said deep memory signal display device during the performance of any of steps b)–f), inclusive of step b').

11. A circuit for rapidly displaying large data records retrieved by a deep memory signal display device, comprising:

a) a sectioned memory;

b) a first data compression circuit with a digitized data record input, and a first compressed data output, said first compressed data output being associated with a first memory section; and c) a second data compression circuit with an input connected to the first compressed data output, and a second compressed data output, said second compressed data output being associated with a second memory section;

wherein a digitized data record comprising a first number of samples is received at the digitized data record input; a second number of samples fewer in number than the first number of samples, is generated at the first compressed data output; and a third number of samples, fewer in number than the second number of samples, is generated at the second compressed data output.

12. A circuit as in claim 11, wherein said first and second data compression circuits respectively comprise:

a) first and second logic blocks having first and second feedback loops; and b) first and second decimators, respectively placed in the first and second feedback loops of said first and second logic blocks.

13. A circuit as in claim 12, wherein said first decimator is of a lower ratio than said second decimator.

14. A circuit as in claim 11, wherein the sectioned memory is divided into first and second divisions, the circuit further comprising:

d) a first gate having an input connected to the first compressed data output, and a first gated output, said first gated output being responsive to receipt of a new digitized data record, and said first gated output being alternately gated to a first section of said first memory division and a first section of said second memory division; and e) a second gate having an input connected to the second compressed data output, and a second gated output, said second gated output being responsive to receipt of a new digitized data record, and said first gated output being alternately gated to a second section of said first memory division and a second section of said second memory division.

15. A circuit as in claim 11, further comprising:

d) a third data compression circuit with a digitized signal sample input, and a third compressed data output associated with a third memory section;

e) a fourth data compression circuit with an input attached to the third compressed data output, and a fourth compressed data output associated with a fourth memory section; and f) means, responsive to receipt of a new digitized data record, for alternately feeding said digitized sample record through the first and second data compression circuits or the third and fourth data compression circuits.

16. A circuit as in claim 15, wherein the first and second memory sections comprise a first memory division, and the third and fourth memory sections comprise a second memory division.

17. A circuit as in claim 16, wherein said first and second memory divisions each comprise an additional memory section, and said alternate feeding means alternately feeds said digitized data record to each of the additional memory sections of said first and second memory divisions.

18. A circuit as in claim 11, wherein each of said data compression circuits is of a peak detect type.

19. A circuit as in claim 11, wherein each of said data compression circuits is of a glitch detect type.

20. A deep memory signal display device for rapidly displaying large data records, comprising:
   a) an A/D converter comprising an analog signal input and a digitized data record output;
   b) a sectioned memory;
   c) a video processor, connected to the sectioned memory;
   d) a video display, connected to the video processor;
   e) a first data compression circuit comprising an input connected to the digitized data record output of the A/D converter, and a first compressed data output, said first compressed data output being associated with a first memory section; and
   f) a second data compression circuit comprising an input connected to the first compressed data output, and a second compressed data output, said second compressed data output being associated with a second memory sections;
   wherein a digitized data record comprising a first number of samples is generated at the digitized data record output; a second number of samples, fewer in number than the first number of samples, is generated at the first compressed data output; and a third number of samples, fewer in number than the second number of samples, is generated at the second compressed data output.

21. A signal display device as in claim 20, wherein said first and second data compression circuits respectively comprise:
   a) first and second logic blocks having first and second feedback loops; and
   b) first and second decimators, respectively placed in the first and second feedback loops of said first and second logic blocks.

22. A signal display device as in claim 21, wherein said first decimator is of a lower ratio than said second decimator.

23. A signal display device as in claim 20, wherein the sectioned memory is divided into first and second divisions, the signal display device further comprising:
   g) a first gate having an input connected to the first compressed data output, and a first gated output, said first gated output being responsive to receipt of a new digitized data record, and said first gated output being alternately gated to a first section of said first memory division and a first section of said second memory division; and
   h) a second gate having an input connected to the second compressed data output, and a second gated output, said second gated output being responsive to receipt of a new digitized data record, and said first gated output being alternately gated to a second section of said first memory division and a second section of said second memory division.

24. A signal display device as in claim 20, wherein each of said data compression circuits is of a peak detect type.

25. A signal display device as in claim 20, wherein each of said data compression circuits is of a glitch detect type.

* * * * *